(12) United States Patent
Zheng

(10) Patent No.: US 12,474,376 B2
(45) Date of Patent: Nov. 18, 2025

(54) APPARATUS AND METHOD FOR 2-PHASE COOLING OF TEST ARRAY AND CONDENSATION PREVENTION DURING DEVICE TESTING

(71) Applicant: Advantest Corporation, Tokyo (JP)

(72) Inventor: Peter Weixiang Zheng, San Jose, CA (US)

(73) Assignee: Advantest Corporation, Tokyo (JP)

(*) Notice: Subject to any disclaimer, the term of this patent is extended or adjusted under 35 U.S.C. 154(b) by 146 days.

(21) Appl. No.: 18/140,448

(22) Filed: Apr. 27, 2023

(65) Prior Publication Data

US 2024/0361357 A1  Oct. 31, 2024

(51) Int. Cl.
  *G01R 1/44*  (2006.01)
  *G01R 31/28*  (2006.01)
  *H05K 7/20*  (2006.01)

(52) U.S. Cl.
  CPC .......... *G01R 1/44* (2013.01); *G01R 31/2834* (2013.01); *H05K 7/20309* (2013.01); *H05K 7/20327* (2013.01)

(58) Field of Classification Search
  CPC .. G01R 1/44; G01R 31/2877; G01R 31/2831; G01R 31/2875; F25B 41/31; F25B 39/02; F25B 47/006; F25B 2400/054; F25B 39/00; F25B 41/33; F25B 1/02; F25B 2500/28; F25B 2700/2103; F25B 2700/21175; F25B 39/028; F25B 2600/2515; F25B 2600/111; F25B 45/00; F25B 49/027; F28F 3/12; H05K 7/20; H05K 7/20145; H05K 7/20272; F25D 21/04; F25D 31/00
See application file for complete search history.

(56) References Cited

U.S. PATENT DOCUMENTS

| | | | | |
|---|---|---|---|---|
| 4,307,578 A * | 12/1981 | Ecker | ...................... | F25B 13/00 |
| | | | | 165/157 |
| 4,392,362 A * | 7/1983 | Little | ...................... | F25B 9/02 |
| | | | | 29/890.035 |
| 5,365,749 A * | 11/1994 | Porter | ................... | H01L 23/427 |
| | | | | 165/104.33 |
| 5,823,005 A * | 10/1998 | Alexander | ............ | H01L 23/467 |
| | | | | 62/401 |
| 6,938,432 B2 | 9/2005 | Enomoto | | |
| 7,343,753 B2 * | 3/2008 | Kidwell | .................. | F25B 30/06 |
| | | | | 165/45 |
| 9,736,962 B2 * | 8/2017 | Yosef | ........................ | F28F 3/12 |

(Continued)

FOREIGN PATENT DOCUMENTS

| | | |
|---|---|---|
| CN | 100565855 | 12/2009 |
| CN | 104718459 | 6/2015 |

(Continued)

*Primary Examiner* — Vinh P Nguyen

(57) ABSTRACT

Embodiments disclosed herein provide cooling for a test array (e.g., a semiconductor test array) using a 2-phase refrigerant. Testing can be performed without any added insulation, which improves test site density significantly. The refrigerant can be provided by any suitable refrigerant source, such as a pump or valve-controlled pressure chamber, for example, and can be provided to a cold plate of a test site, for example. The cold plate can include a flow field or flow channels for guiding the refrigerant to evenly cool surfaces and/or prevent condensation forming on outer surfaces of the cold plate or test site.

20 Claims, 6 Drawing Sheets

(56) References Cited

U.S. PATENT DOCUMENTS

| | | | |
|---|---|---|---|
| 10,119,776 B2* | 11/2018 | Di Stefano | ............. F25B 29/00 |
| 11,499,784 B2* | 11/2022 | Maeda | .................... F28D 21/00 |
| 2016/0128225 A9 | 5/2016 | Yosef et al. | |
| 2021/0123642 A1 | 4/2021 | Yosef et al. | |
| 2021/0123971 A1 | 4/2021 | Gneupel | |

FOREIGN PATENT DOCUMENTS

| | | |
|---|---|---|
| CN | 111307922 | 6/2020 |
| TW | I551803 | 10/2016 |

* cited by examiner

APPARATUS AND METHOD FOR 2-PHASE COOLING OF TEST ARRAY AND CONDENSATION PREVENTION DURING DEVICE TESTING

FIELD

Embodiments of the present invention generally relate to the field of device testing. More specifically, embodiments of the present invention relate to devices that prevent and/or reduce the formation of condensation during device testing.

BACKGROUND

A device or equipment under test (DUT) is typically tested to determine the performance and consistency of the device before the device is sold. For example, a DUT can be tested using a large variety of test cases, and the result of the test cases can be compared to an expected output result. When the result of a test case does not match a satisfactory value or range of values, the device can be considered a failed device or outlier, and the device can be binned based on performance, etc.

A DUT is usually tested by automatic or automated test equipment (ATE), which may be used to conduct complex testing using software and automation to improve the efficiency of testing. The DUT may be any type of semiconductor device, wafer, or component that is intended to be integrated into a final product, such as a computer, network interface, or solid-state drive (SSD). By removing defective or unsatisfactory chips at manufacture using ATE, the quality of the yield can be significantly improved.

Testing often causes DUTs to heat up. Cooling systems are therefore utilized. Cooling devices under test often generates a significant amount of condensation when temperatures are below the dewpoint. During testing, temperatures often are maintained near −10 degrees Celsius. The resultant condensation can result in water dripping on controllers or other test system components and electronics, which can damage the components and prevent further device testing.

In a semiconductor test array, multiple cold plates are typically included to remove heat from the test sites using air, liquid, or a 2-phase refrigerant. In the 2-phase semiconductor test array 100 depicted in FIG. 1, the heat in each test site is removed by employing a cold 2-phase refrigerant. In the example of FIG. 1, cold vapor flows through an outer conduit of a coaxial conduit, and warm liquid flows through the inner conduit. The cold refrigerant temperature is often below the dewpoint of the ambient environment, which unfortunately causes condensation on the surfaces of the piping that carries the cold refrigerant to and from cold plate, as well as on the surfaces of the cold plate. Therefore, significant amounts of bulky insulation are typically installed around the tubing, which significantly reduces test site density.

FIG. 2 depicts an exemplary 2-phase semiconductor test array with insulation 210 used to prevent water damage (from condensation) to components of the test system 200 during test of DUTs 205. The significant amount of insulation used in the 2-phase semiconductor test array greatly reduces the test site density, which negatively impacts the efficiency of test system 200. Moreover, even with the insulation, water damage can still occur when the condensation is significant. Better systems are needed to manage the condensation issues involved in device testing.

SUMMARY

Accordingly, what is needed is an approach to testing devices that significantly reduces or prevents the formation of condensation by maintaining the surface of devices under test at a temperature that is above the dewpoint. In accordance with embodiments of the present invention, the amount of insulation required to prevent water damage to components of the test system is advantageously reduced, and therefore more test sites can be included in the test system for testing more DUTs, which significantly improves testing efficiency. The device under test can be a memory device, processor, etc.

According to one embodiment, an apparatus for cooling a test system during device testing is disclosed. The apparatus include a coaxial tube including an outer tubing and an inner tubing, a cold plate including a flow field operable to cool a test site during testing of a device under test (DUT), and an expansion valve operable to receive high-pressure refrigerant from the outer tubing, reduce a pressure of the high-pressure refrigerant to produce a low-pressure refrigerant, and output the low-pressure refrigerant to the flow field to cool the cold plate and the DUT.

According to some embodiments, the high-pressure refrigerant is operable to substantially prevent condensation forming on an outer surface of the coaxial tube during testing.

According to some embodiments, the high-pressure refrigerant is operable to substantially prevent condensation forming on the cold plate during testing.

According to some embodiments, the cold plate further includes a flow channel disposed along a perimeter of the cold plate, and the flow channel receives the high-pressure refrigerant to heat a surface of the cold plate to a temperature above a dewpoint threshold.

According to some embodiments, the cold plate further includes a surface exposed to an ambient environment, and the flow channel is operable to maintain temperatures of the surface exposed to the ambient environment above a dewpoint threshold of the ambient environment using the high-pressure refrigerant to prevent condensation forming on the surface.

According to some embodiments, the cold plate further includes an evaporator operable to remove heat from the test site.

According to some embodiments, the coaxial tube includes a flexible material, the coaxial tube is integral to the cold plate such that surfaces of the coaxial tube are not exposed to an ambient environment, and the inner tubing of the coaxial tube substantially reduces heat transfer between the low-pressure refrigerant and the high-pressure refrigerant to prevent condensation on an outer surface of the coaxial tube.

According to another embodiment, a method of cooling a device under test (DUT) is disclosed. The method includes providing high-pressure refrigerant to a cold plate of a test site via an outer tubing of a coaxial tube, where the test site is operable to receive and control a DUT during testing, converting the high-pressure refrigerant to a low-pressure refrigerant using an expansion valve, and providing the low-pressure refrigerant to a cold plate of the test site via an inner tubing of the coaxial tube to cool the DUT.

According to some embodiments, the high-pressure refrigerant is operable to substantially prevent condensation forming on an outer surface of the coaxial tube during the testing.

According to some embodiments, the high-pressure refrigerant is operable to substantially prevent condensation forming on the cold plate during the testing.

According to some embodiments, the cold plate further includes a flow channel disposed along a perimeter thereof, where the flow channel receives the high-pressure refrigerant to heat a surface of the cold plate to a temperature above a dewpoint threshold.

According to some embodiments, the cold plate further includes a surface exposed to an ambient environment, where the flow channel is operable to maintain temperatures of the surface exposed to the ambient environment above a dewpoint of the ambient environment using the high-pressure refrigerant to prevent condensation forming on the surface.

According to some embodiments, the cold plate further includes an evaporator operable to remove heat from the test site.

According to some embodiments, the coaxial tube includes a flexible material, the coaxial tube is integral to the cold plate such that surfaces of the coaxial tube are not exposed to an ambient environment, and the inner tubing of the coaxial tube substantially reduces heat transfer between the cold, low-pressure refrigerant and the high-pressure refrigerant to prevent condensation on an outer surface of the coaxial tube.

According to a different embodiment, a test system is disclosed that includes a pressurized refrigerant source, a coaxial tube including an outer tubing and an inner tubing, the coaxial tube is coupled to the refrigerant source and to a cold plate, the test site including a device under test (DUT) receiver, the cold plate operable to receive refrigerant from the refrigerant source to cool the cold plate during testing of the DUT, and an expansion valve coupled to the cold plate and operable to convert the refrigerant from a high-pressure refrigerant to a low-pressure refrigerant, the low-pressure refrigerant is provided to the cold plate to cool the cold plate and the DUT.

According to some embodiments, the high-pressure refrigerant is operable to flow through the outer tubing to substantially reduce condensation forming on an outer surface of the coaxial tube.

According to some embodiments, the cold plate further includes a flow channel disposed along a perimeter of the cold plate and an exposed surface, and the high-pressure refrigerant flows through the outer tubing into the flow channel to warm the exposed surface above a dewpoint.

According to some embodiments, the flow channel is operable to maintain temperatures of the exposed surface of the cold plate above a dewpoint threshold of an ambient environment of the cold plate.

According to some embodiments, the coaxial tube includes a flexible material, the coaxial tube is integral to the cold plate such that surfaces of the coaxial tube are not exposed to an ambient environment, and the inner tubing of the coaxial tube substantially prevents heat transfer between the low-pressure refrigerant and the high-pressure refrigerant to reduce condensation on an outer surface of the coaxial tube.

According to some embodiments, the cold plate includes an evaporator operable to remove heat from the test site.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Figure 4:
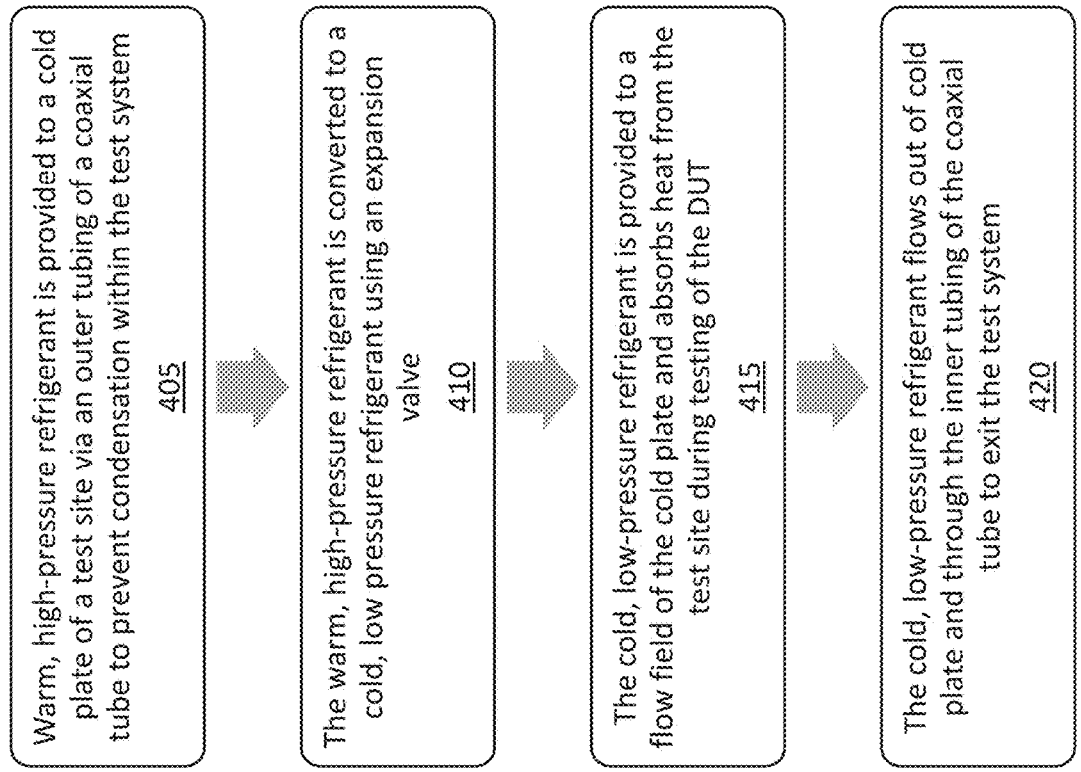
FIG. 4 is a flowchart depicting an exemplary sequence of a method for automatically cooling a test site that provides cooling without producing significant condensation according to embodiments of the present invention.

Portions of the detailed description that follows are presented and discussed in terms of a method (e.g., FIG. 4). Although steps and sequencing thereof are disclosed in a figure herein describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, parameters, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," "labeling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, algorithms, programs, objects, components, data structures, etc. that perform particular tasks or implement particular abstract data types. Typically the functionality of the program modules may be combined or distributed as desired in various embodiments.

Cooling System with Condensation Prevention for 2-Phase Test Array

Embodiments of the present invention provide cooling for a test array (e.g., a semiconductor test array) using a 2-phase refrigerant. Testing can be performed without any added insulation, which improves test site density significantly. The refrigerant can be provided by any suitable refrigerant source, such as a pump or valve-controlled pressure chamber, for example, and can be provided to a cold plate of a test site, for example. The cold plate can include a flow field or flow channels for guiding the refrigerant to evenly cool surfaces and/or prevent condensation forming on outer surfaces of the cold plate or test site.

Figure 1:
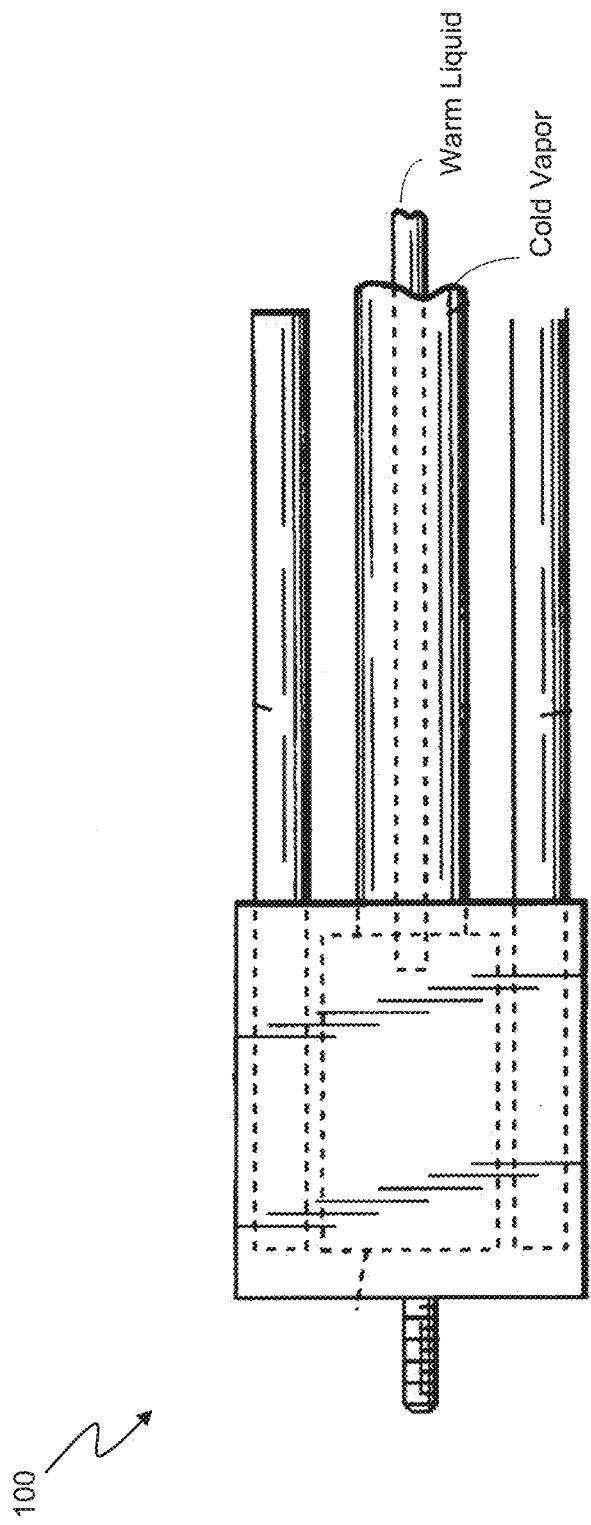
FIG. 1 is a block diagram of an exemplary 2-phase cooling apparatus.
Figure 2:
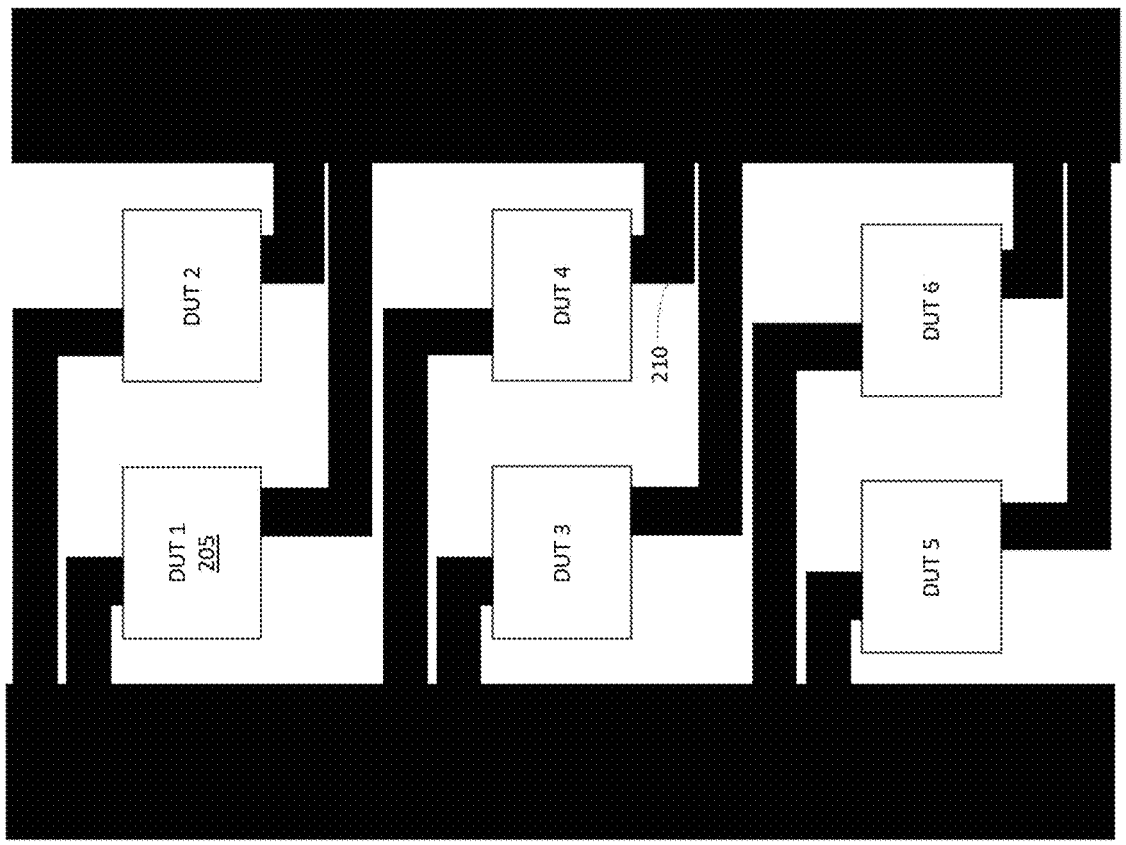
FIG. 2 is a diagram of a 2-phase semiconductor test array with insulation installed around the tubing of the test system to prevent water damage.
Figure 3A:
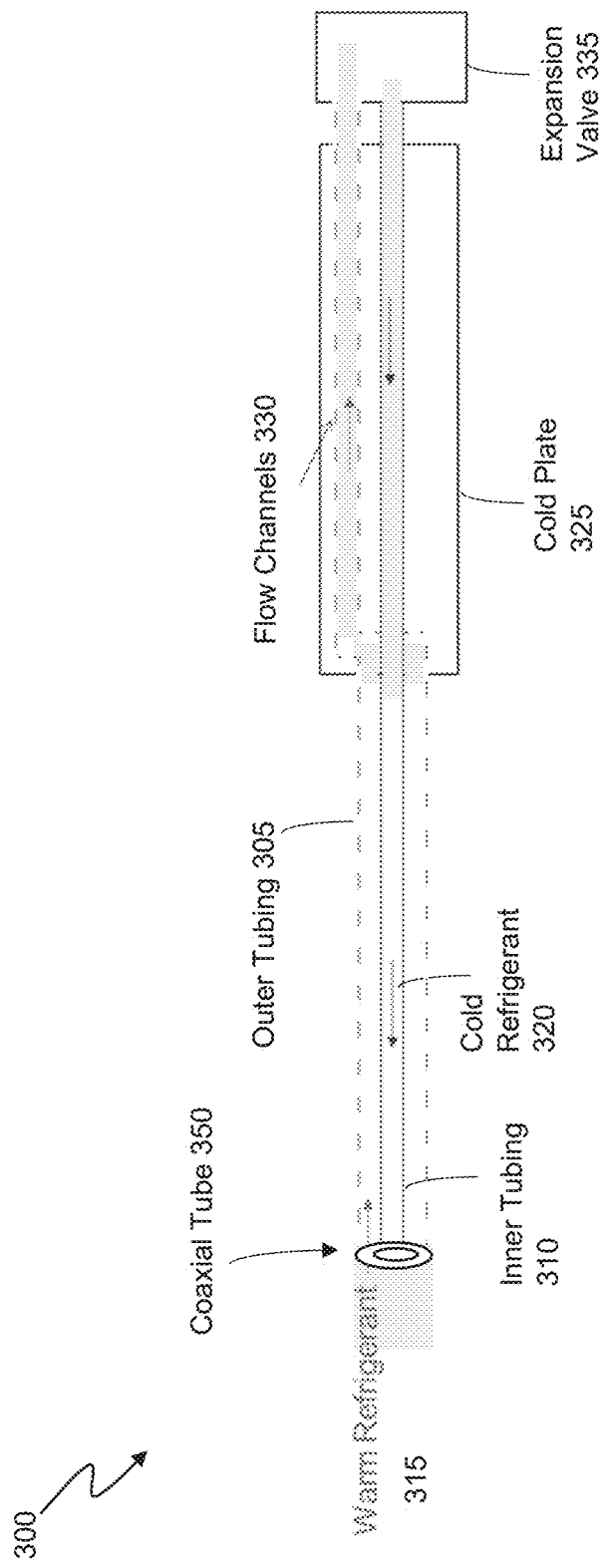
FIG. 3A is a side view of an exemplary 2-phase cooling apparatus for preventing condensation in a semiconductor test array according to embodiments of the present invention.
Figure 3B:
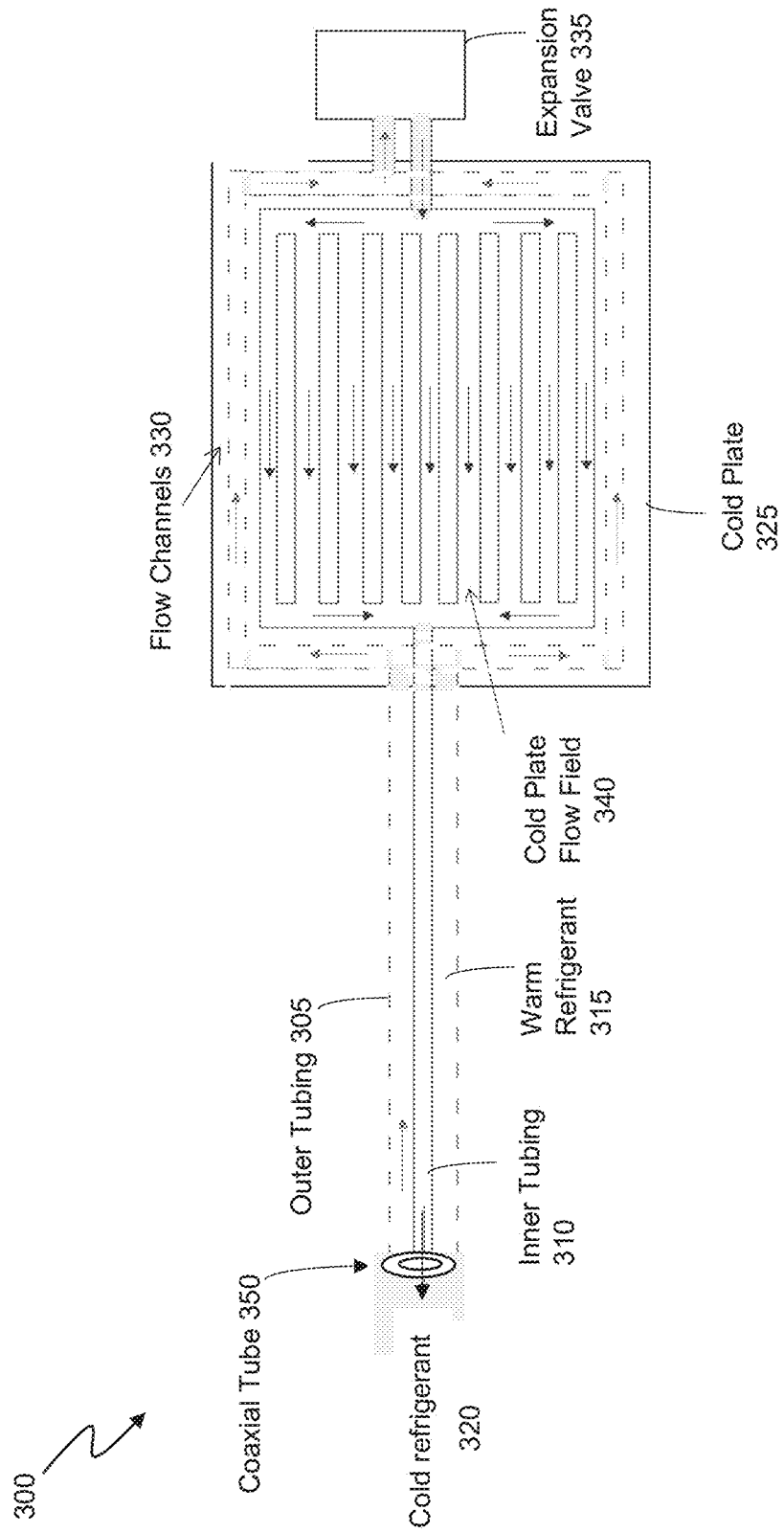
FIG. 3B is a top-down view of an exemplary 2-phase cooling apparatus for preventing condensation in a semiconductor test array according to embodiments of the present invention.

FIG. 3A depicts a side view of an exemplary cooling apparatus 300 for a 2-phase semiconductor test array that substantially reduces or prevents the formation of condensation during testing according to embodiments of the present invention. FIG. 3B shows a top-down view of exemplary cooling apparatus 300 according to embodiments of the present invention. Test array 300 includes a cold plate 325 that is cooled by cold refrigerant 320 flowing through inner tubing 310 of a coaxial tube. The channels of flow field 340 are used to evenly cool DUTs to a desired temperature range or to prevent overheating during testing, for example. It is appreciated that warm refrigerant 315 carried by outer tubing 305 flows into flow channels 330 of cold plate 325 to advantageously maintains the surface of the coaxial tubing at a temperature above the dewpoint of the local environment during testing to substantially reduce or prevent condensation forming thereon.

Expansion valve 335 reduces the pressure of the refrigerant flowing through the outer tube from a warm, high-pressure refrigerant to a cold, low-pressure 2-phase refrigerant. The refrigerant cycles through cooling apparatus 300 to cool the cold plate and returns from the test site without requiring the use of bulky insulation to prevent condensation and water damage. The testing system can include multiple test sites for testing multiple DUTs (e.g., a test array). Moreover, the warm refrigerant can be directed to the cold surfaces of cold plate that are exposed to ambient temperatures. The warm refrigerant prevents condensation on the cold surfaces of cold plate that are exposed to ambient temperatures without insulation. The coaxial tubing can be flexible according to different embodiments. The coaxial tubing can be well-integrated into the cold plate to prevent cold surfaces being exposed to the ambient environment.

In the examples of FIGS. 3A and 3B, cold plate 325 is an evaporator with a flow field 340 that removes heat from the semiconductor test site. The semiconductor test site includes a DUT receiver for testing a DUT (wafer only, no packaging). Warm refrigerant flows to the cold plate 325 via outer tubing 305 of the coaxial tube 350 and maintains outer tubing 305 of coaxial tubing 350 at a relatively warm temperature. The warm refrigerant in cold plate 325 is directed to flow channels 330, which can be disposed around the perimeter of cold plate 325, to maintain the surfaces of the cold plate that are exposed to the ambient environment at a temperature that is above the dewpoint. After flowing through cold plate 325, the warm refrigerant enters expansion valve 335 where it reduces in pressure and becomes cold 2-phase refrigerant. The cold 2-phase refrigerant flows out from expansion valve 335 and through cold plate flow field 340 where the cold 2-phase refrigerant absorbs the heat from the test site and evaporates. The remaining cold 2-phase refrigerant leaves the cold plate 325 and flows through inner tubing 310 of the coaxial tubing 350. The warm refrigerant keeps the surfaces of the coaxial tubing 350 and the cold plate 325 warm and substantially prevents condensation.

The warm refrigerant can be any liquid refrigerant that has low degree of subcooling (delta temperature below the saturation temperature) or any 2-phase refrigerant with a small quality (percentage of vapor in refrigerant) to keep temperatures of the outer surface of the coaxial tubing and the ambient-exposed surfaces of cold plate above the dewpoint of ambient environment.

FIG. 4 is a flow chart depicting an exemplary sequence of a method 400 for automatically cooling a DUT or other test equipment using a 2-phase refrigerant that substantially mitigates or prevents the formation of condensation according to embodiments of the present invention.

At step 405, warm, high-pressure refrigerant is provided to a cold plate of a test site for testing a device under test via an outer tubing of a coaxial tube.

At step 410, the warm, high-pressure refrigerant is converted to a cold, low pressure refrigerant using an expansion valve or similar means.

At step 415, the cold, low-pressure refrigerant is provided to a flow field of the cold plate and absorbs heat from the test site during testing of the DUT. For example, the cold plate can be an evaporator with a flow field that removes heat from the test site, which can be a semiconductor test site, for example.

At step 420, the cold, low-pressure refrigerant flows out of the cold plate and exits through the inner tubing of the coaxial tube. The warm refrigerant keeps the surfaces of the coaxial tube and cold plate at a temperature that is relatively warm and thereby prevents condensation, so no bulky insulation is required.

Figure 5:
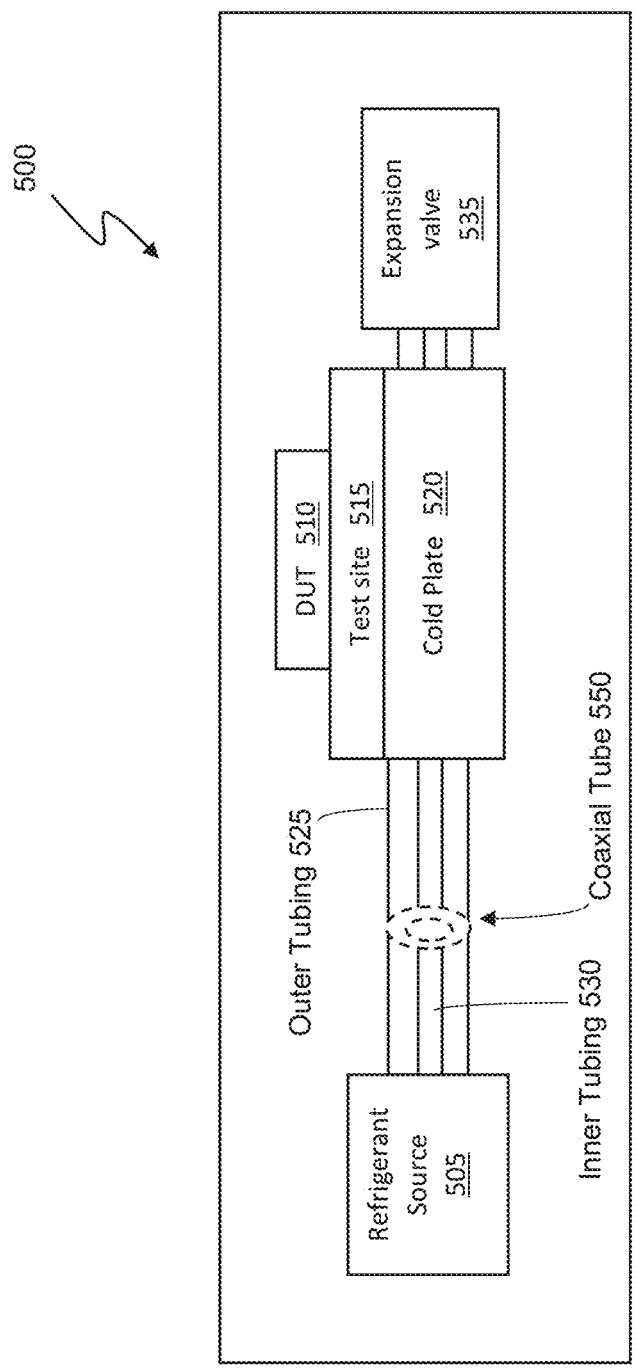
FIG. 5 is a block diagram of an exemplary test system including a pressurized fluid source for performing 2-phase cooling of a cold plate of the test site according to embodiments of the present invention.

FIG. 5 is a block diagram of an exemplary test system 500 with a coaxial tube that provides warm, high-density refrigerant to prevent condensation during testing, and an expansion valve that converts the refrigerant to a cold, low-density refrigerant to cool cold plate 520 to a desired temperature during testing of DUT 510. Test system 500 can include multiple test sites for testing multiple DUTs, and the test sites can be cooled by the cold, low-density refrigerant flowing from expansion valve 535 to cold plate 520. Expansion valve 535 can be an evaporator, for example, and the cold plate can include a flow field that receives the cold, low-density refrigerant to cool DUT 510.

Cold plate 520 can include flow channels around the perimeter of the cold plate, for example, that receive the warm, high-density refrigerant from coaxial tube 550 to prevent condensation on surfaces of the cold plate, coaxial tube 550, and other surfaces of test system 500. Advantageously, test system 500 does not include insulation for preventing condensation or water damage, which improves test site density as more test sites can fit within a testing enclosure or board.

According to some embodiments, the inner tubing of the coaxial tubing minimizes heat transfer between the cold and warm refrigerants, so the warm refrigerant stays warm to prevent condensation forming on the outer surface of the coaxial tubing.

Embodiments of the present invention are thus described. While the present invention has been described in particular embodiments, it should be appreciated that the present invention should not be construed as limited by such embodiments, but rather construed according to the following claims.

What is claimed is:

1. An apparatus for cooling a test system during device testing, the apparatus comprising:
   a coaxial tube comprising an outer tubing and an inner tubing;
   a cold plate comprising a flow field operable to cool a test site during testing of a device under test (DUT); and
   an expansion valve operable to:
      receive high-pressure refrigerant from the outer tubing;
      reduce a pressure of the high-pressure refrigerant to produce a low-pressure refrigerant; and
      output the low-pressure refrigerant to the flow field to cool the cold plate and the DUT via the inner tubing.

2. The apparatus of claim 1, wherein the high-pressure refrigerant is operable to substantially prevent condensation forming on an outer surface of the coaxial tube during said testing.

3. The apparatus of claim 1, wherein the high-pressure refrigerant is operable to substantially prevent condensation forming on the cold plate during said testing.

4. The apparatus of claim 1, wherein said cold plate further comprises a flow channel disposed along a perimeter thereof, wherein said flow channel receives the high-pressure refrigerant to heat a surface of the cold plate above to a temperature above a dewpoint.

5. The apparatus of claim 4, wherein said cold plate further comprises a surface exposed to an ambient environment, and wherein said flow channel is operable to maintain temperatures of the surface exposed to the ambient environment above the dewpoint using the high-pressure refrigerant to prevent condensation forming on the surface.

6. The apparatus of claim 1, wherein said cold plate further comprises an evaporator operable to remove heat from the test site.

7. The apparatus of claim 1, wherein the coaxial tube further comprises a flexible material, wherein the coaxial tube is integral to the cold plate wherein surfaces of the coaxial tube are not exposed to an ambient environment, and wherein the inner tubing of the coaxial tube is operable to substantially reduce heat transfer between the low-pressure refrigerant and the high-pressure refrigerant to prevent condensation on an outer surface of the coaxial tube.

8. A method of cooling a device under test (DUT), the method comprising:
   providing high-pressure refrigerant to a cold plate of a test site via an outer tubing of a coaxial tube, wherein the test site is operable to receive and control a DUT during testing;
   converting the high-pressure refrigerant to a low-pressure refrigerant using an expansion valve; and
   providing the low-pressure refrigerant to a cold plate of the test site via an inner tubing of the coaxial tube to cool the DUT.

9. The method of claim 8, wherein the high-pressure refrigerant is operable to substantially prevents condensation forming on an outer surface of the coaxial tube during said testing.

10. The method of claim 8, wherein the high-pressure refrigerant is operable to substantially prevent condensation forming on the cold plate during said testing.

11. The method of claim 8, wherein said cold plate further comprises a flow channel disposed along a perimeter thereof, and wherein said flow channel receives the high-pressure refrigerant to heat a surface of the cold plate to a temperature above a dewpoint.

12. The method of claim 11, wherein said cold plate further comprises a surface exposed to an ambient environment, wherein said flow channel is operable to maintain temperatures of the surface exposed to the ambient environment above the dewpoint using the high-pressure refrigerant to prevent condensation forming on the surface.

13. The method of claim 8, wherein said cold plate further comprises an evaporator operable to remove heat from the test site.

14. The method of claim 8, wherein the coaxial tube comprises a flexible material, wherein the coaxial tube is integral to the cold plate wherein surfaces of the coaxial tube are not exposed to an ambient environment, and wherein the inner tubing of the coaxial tube substantially reduces heat transfer between the low-pressure refrigerant and the high-pressure refrigerant to prevent condensation on an outer surface of the coaxial tube.

15. A test system, comprising:
   a pressurized refrigerant source;
   a coaxial tube comprising an outer tubing and an inner tubing, wherein the coaxial tube is coupled to the pressurized refrigerant source and to a cold plate;
   a test site comprising a device under test (DUT) receiver;
   the cold plate operable to receive refrigerant from the pressurized refrigerant source via the inner tubing to cool the cold plate during testing of the DUT; and
   an expansion valve coupled to the cold plate and operable to convert the refrigerant from a high-pressure refrigerant to a low-pressure refrigerant, wherein the low-pressure refrigerant is provided to the cold plate via the inner tubing to cool the cold plate and the DUT.

16. The test system of claim 15, wherein the high-pressure refrigerant is operable to flow through the outer tubing to substantially reduce condensation forming on an outer surface of the coaxial tube.

17. The test system of claim 15, wherein the cold plate further comprises:
   a flow channel disposed along a perimeter of the cold plate; and
   an exposed surface, and
   wherein the high-pressure refrigerant flows through the outer tubing into the flow channel to warm the exposed surface of the cold plate.

18. The test system of claim 17, wherein said flow channel is operable to maintain temperatures of the exposed surface of the cold plate above a dewpoint of an ambient environment of the cold plate.

19. The test system of claim 15, wherein the coaxial tube comprises a flexible material, wherein the coaxial tube is integral to the cold plate such that surfaces of the coaxial tube are not exposed to an ambient environment, and wherein the inner tubing of the coaxial tube substantially prevents heat transfer between the low-pressure refrigerant and the high-pressure refrigerant to reduce condensation on an outer surface of the coaxial tube.

20. The test system of claim 15, wherein the cold plate comprises an evaporator operable to remove heat from the test site.

* * * * *